(12) United States Patent
Devins et al.

(10) Patent No.: US 7,711,534 B2
(45) Date of Patent: May 4, 2010

(54) METHOD AND SYSTEM OF DESIGN VERIFICATION

(75) Inventors: Robert J. Devins, Essex Junction, VT (US); David W. Milton, Underhill, VT (US); Pascal A. Nsame, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 702 days.

(21) Appl. No.: 11/275,093

(22) Filed: Dec. 9, 2005

(65) Prior Publication Data

US 2006/0064296 A1  Mar. 23, 2006

(51) Int. Cl.
*G06F 17/50* (2006.01)

(52) U.S. Cl. .............. 703/13; 703/6; 703/14; 703/16; 703/17; 716/6; 716/5; 716/7

(58) Field of Classification Search ............ 703/13, 703/14, 17, 20, 4, 18, 23; 714/12, 15, 741, 714/33, 37; 716/1, 4–6
See application file for complete search history.

(56) References Cited

U.S. PATENT DOCUMENTS

| | | | |
|---|---|---|---|
| 3,786,430 A | 1/1974 | Hajdu et al. | |
| 4,583,222 A | 4/1986 | Fossum et al. | |
| 4,873,656 A | 10/1989 | Catlin | |
| 4,959,781 A | 9/1990 | Rubinstein et al. | |
| 5,097,412 A | 3/1992 | Orimo et al. | |
| 5,167,023 A | 11/1992 | Nicolas et al. | |
| 5,301,302 A | 4/1994 | Blackard et al. | |
| 5,488,713 A | 1/1996 | Norton et al. | |
| 5,805,867 A | 9/1998 | Kodaira | |
| 5,862,366 A | 1/1999 | Schmidt et al. | |
| 6,014,512 A | 1/2000 | Mohamed et al. | |
| 6,115,763 A | 9/2000 | Douskey et al. | |
| 6,158,022 A * | 12/2000 | Avidan ................ | 714/33 |
| 6,199,031 B1 | 3/2001 | Challier et al. | |
| 6,208,954 B1 | 3/2001 | Houtchens | |

(Continued)

FOREIGN PATENT DOCUMENTS

JP    62157961    7/1987

(Continued)

OTHER PUBLICATIONS

Amendola et al. Fault Behavior Observation of a Microprocessor System through a VHDL Simulation-Based Injection Experiment 0-8186-7573-X/96, 1996 IEEE.*

(Continued)

*Primary Examiner*—Kamini S Shah
*Assistant Examiner*—Cuong V Luu
(74) *Attorney, Agent, or Firm*—Ryan K. Simmons; Greenblum & Bernstein P.L.C.

(57) ABSTRACT

A method and system comprises extracting resources required to run a discrete test case or set of associated test cases on a design. The method and system further includes building a simulation model based on the extracted resources and executing the simulation model using only the extracted resources, exclusive of an entire design, to test a specific function or group of interrelated functions represented by the discrete test case or set of associated test cases for design verification, and correlating the simulation results with the test plan.

22 Claims, 2 Drawing Sheets

Real Model

Empty Model

U.S. PATENT DOCUMENTS

| | | | |
|---|---|---|---|
| 6,321,181 B1 | 11/2001 | Havens | |
| 6,324,678 B1 * | 11/2001 | Dangelo et al. | 716/18 |
| 6,467,082 B1 | 10/2002 | D'Arcy et al. | |
| 6,510,531 B1 | 1/2003 | Gibbons | |
| 6,606,676 B1 | 8/2003 | Deshpande et al. | |
| 6,625,679 B1 | 9/2003 | Morrison et al. | |
| 6,633,940 B1 | 10/2003 | Alasti et al. | |
| 6,678,645 B1 * | 1/2004 | Rajsuman et al. | 703/20 |
| 6,718,294 B1 | 4/2004 | Bortfeld | |
| 6,732,338 B2 | 5/2004 | Crouse et al. | |
| 6,742,166 B2 * | 5/2004 | Foster et al. | 716/4 |
| 6,810,442 B1 * | 10/2004 | Lin et al. | 710/22 |
| 6,904,398 B1 | 6/2005 | Panesar | |
| 6,925,621 B2 * | 8/2005 | Mielke et al. | 716/6 |
| 6,959,271 B1 * | 10/2005 | Ballam | 703/14 |
| 6,968,514 B2 * | 11/2005 | Cooke et al. | 716/1 |
| 7,000,079 B2 * | 2/2006 | Detjens et al. | 711/141 |
| 7,072,818 B1 * | 7/2006 | Beardslee et al. | 703/14 |
| 7,203,633 B2 * | 4/2007 | Gabele et al. | 703/15 |
| 7,277,841 B1 * | 10/2007 | Novak et al. | 703/18 |
| 7,292,970 B1 * | 11/2007 | Hurlock | 703/23 |
| 2002/0083387 A1 | 6/2002 | Miner et al. | |
| 2003/0131325 A1 * | 7/2003 | Schubert et al. | 716/4 |
| 2003/0149946 A1 * | 8/2003 | Devins et al. | 716/4 |
| 2003/0149962 A1 * | 8/2003 | Willis et al. | 717/135 |
| 2003/0154061 A1 * | 8/2003 | Willis | 703/4 |
| 2003/0191617 A1 * | 10/2003 | Gabele et al. | 703/13 |
| 2003/0191618 A1 * | 10/2003 | Gabele et al. | 703/13 |
| 2003/0191621 A1 * | 10/2003 | Gabele et al. | 703/17 |
| 2003/0237067 A1 * | 12/2003 | Mielke et al. | 716/6 |
| 2005/0010880 A1 * | 1/2005 | Schubert et al. | 716/4 |
| 2005/0071720 A1 * | 3/2005 | Dattaram Kadkade et al. | 714/741 |
| 2005/0081094 A1 * | 4/2005 | Kadkade et al. | 714/12 |
| 2005/0081103 A1 * | 4/2005 | Kadkade | 714/37 |
| 2005/0149312 A1 * | 7/2005 | McGaughy | 703/14 |
| 2005/0283664 A1 * | 12/2005 | Coulter et al. | 714/15 |
| 2006/0271890 A1 * | 11/2006 | Hekmatpour et al. | 716/5 |

FOREIGN PATENT DOCUMENTS

| | | |
|---|---|---|
| JP | 04-148461 A | 5/1992 |
| JP | 09-325946 A | 12/1997 |

OTHER PUBLICATIONS

*OS and Compiler Considerations in the Design of the IA-64 Architecture*—Zahir, R. et al.; 2000.

*On Processes and Interrupts*—Gerrity, GW.; 1981.

*Synchronizing Processors with Memory-Content-Generated Interrupts*—Hill, JC.; 1973.

*A Scalable and Flexible Data Synchronization Scheme for Embedded HW-SW Shared-Memory Systems*—Gangwal, OP. et al.; 2001.

* cited by examiner

Real Model

Empty Model

FIG. 2

METHOD AND SYSTEM OF DESIGN VERIFICATION

FIELD OF THE INVENTION

The invention relates to a method and system of testing and/or verifying designs, and more particularly to a method and system of system-on-chip (SoC) design verification using simulation processes. Background

DESCRIPTION

Present-day integrated circuit (IC) chips have advanced significantly in both complexity and sophistication. For example, in early generation chip designs, a chip might embody relatively simple electronic logic blocks effected by interconnections between logic gates; whereas, newer generation chips include designs having combinations of complex, modularized IC designs often called "cores", which together constitute an entire SoC. These newer generation IC designs significantly increase the overall functionality and performance characteristics of the chip, itself, by for example, having the ability to include smaller feature sizes and thus increasing the amount of circuitry which can be built on a single chip. But, this comes at a cost: longer design and verification times which, in turn, translate into added development and manufacturing costs.

To design such complex IC chips, the IC chip development includes a design phase and a verification phase, of which the latter is critical to the determination of the workability and hence functionality of the chip, itself. For example, it is in the verification phase that a determination is made as to whether a design works as expected.

The verification phase has moved toward a software simulation approach to avoid the costs of first implementing designs in hardware to verify the workability of such designs. However, multiprocessor and multicore designs can lead to very large simulation models due to the fact that the entire design and testbench must be constructed for every simulation. Even when using modern simulation tools, simulation load and execution time, as well as build time can become cost and time prohibitive. This is especially true in complex design cases since a complete gate level representation of the design must be constructed and loaded into the simulation.

By way of illustration, in verifying a design, a simulator (e.g., specialized software whose functions include accepting software written in a hardware description language (HDL) such as Verilog or VHDL) models a circuit design (e.g., a core) in order to simulate a response of the design. This response is applied by a test case to determine whether the design functions as expected. However, to achieve acceptably bug-free designs, the verification software must load the complete design into existing tools in order to satisfactorily verify the design, i.e., applying a number of test cases to fully exercise the design in simulation.

As the chip design becomes more complex in both individual cores and the interactions between cores, the verification tends to require an even more inordinate amount of time and computing resources, largely due to the modeling and verification of the interaction of functions associated with the entire design. That is, for example, the verification process becomes exponentially longer due to the need to load and exercise an entire test design for testing only one function or an interaction between two or more functions. These inefficiencies in current verification methodologies exacerbate time pressures and increase, significantly, the time-to-market, a key factor for developers and marketers of IC chips in being competitive in business.

SUMMARY OF THE INVENTION

In a first aspect of the invention, a method comprises extracting resources required to run a discrete test case or set of associated test cases on a design. The method further includes building a simulation model based on the extracted resources and executing the simulation model using only the extracted resources, exclusive of an entire design, to test a specific function or group of interrelated functions represented by the discrete test case or set of associated test cases for design verification.

In embodiments of the invention, the extracted resources are constructed into partitions which are related to the specific function or group of interrelated functions of the design. The simulation model may be partitioned into individual and independent test cases for independent verification needed to test a specific function or group of interrelated functions. In embodiments of the invention, the extracted resources include at least a set of common required elements and test case specified elements.

In further embodiments of the invention, the method includes constructing a build of materials (BOM) generation which includes at least combining chip base elements and test case specific elements representative of the design. The chip base elements are at least a set of common non-test case specific elements. The method further includes, within the test case or set of test cases, providing the resources as a set of KEYWORDS, which are used to specify the resources for the test case or set of test cases. The resources may be hardware and may include at least one of internal and external resources.

In further embodiments of the invention, the method includes parsing the resources for the test case or set of test cases associated with an upcoming simulation run. The method may further include combining the parsed resources with common elements to produce a BOM model build file for compilation. The parsing step may also include identification and access to different BOM model build files for specific test cases. The BOM model build file creates "stub" files for compiling the simulation model, where the stub files instruct a model build process to install a fully functional model and an empty model into the simulation model. The fully functional model behaves accurately in simulation and is synthesized for one partition or a particular group of partitions associated with the specific function or interrelated group of functions, respectively, to be verified. The empty model representation is representative of remaining portions of the design which are not to be simulated and verified.

In another aspect of the invention, the method includes providing a set of common required elements and resources for a design. The resources are parsed for a test case specification and combined with the common required elements to produce a build of materials (BOM) model build file. Stub files are created based on the BOM model build file, to compile a simulation model. The method further includes simulating a discrete function of the design for verification using the simulation model, exclusive of an entire design. The method further includes correlating a result of the simulated discrete function with a test plan.

In further embodiments of the invention, the set of common required elements include non-test case specific elements. The non-test case specific elements describe basic building blocks of the design for the simulation model.

In further embodiments, the simulation model includes partitions of individual and independent subsystems for independent verification of specific functions of the design, exclusive of the entire design. The BOM model build file may be provided for a specific function of the design, and may be saved and reused to leverage system resources. The method may also be used to fabricate an integrated circuit chip for distribution. The method additionally systematically reduces a size and complexity of the simulation model by extracting only the resources required to run a specific test case, or set of test cases on a design using the simulation model.

In further embodiments of the invention, the resources are hardware resources specified as a set of KEYWORDS used to specify test case required resources. The hardware resources create a specific test case for each function to be verified and the BOM model file creates stub files instructing a model build process.

In embodiments of the invention, the model build process includes a real model representation and an empty model representation. The real model representation behaves accurately in simulation and is capable of being synthesized for the test case specification, representative of a function to be verified, exclusive of an entire design. The empty model representation is representative of remaining portion(s) of the design. In further embodiments, "tie-offs" are provided to assert all outputs of the empty model representation to an inactive state thereby ensuring that the empty model representation is not otherwise used in the simulation model. The method additionally includes compiling user specified parameters to generate a specific test to verify in the simulation model using ADF.

In another aspect of the invention, a system is provided which implements the steps of the invention. In yet another aspect of the invention, a computer program product comprising a computer useable medium including a computer readable program is provided which, when executed on a computer, causes the computer to: extract resources required to run a discrete test case or set of associated test cases on a design; build a simulation model based on the extracted resources; and execute the simulation model using only the extracted resources, exclusive of an entire design, to test a specific function or group of interrelated functions represented by the discrete test case or set of associated test cases for design verification. The system further includes correlating a result of the simulated discrete function with a test plan

BRIEF DESCRIPTION OF THE DRAWINGS

FIG. 2 illustrates model representations in accordance with the invention.

DETAILED DESCRIPTION OF EMBODIMENTS OF THE INVENTION

Figure 1:
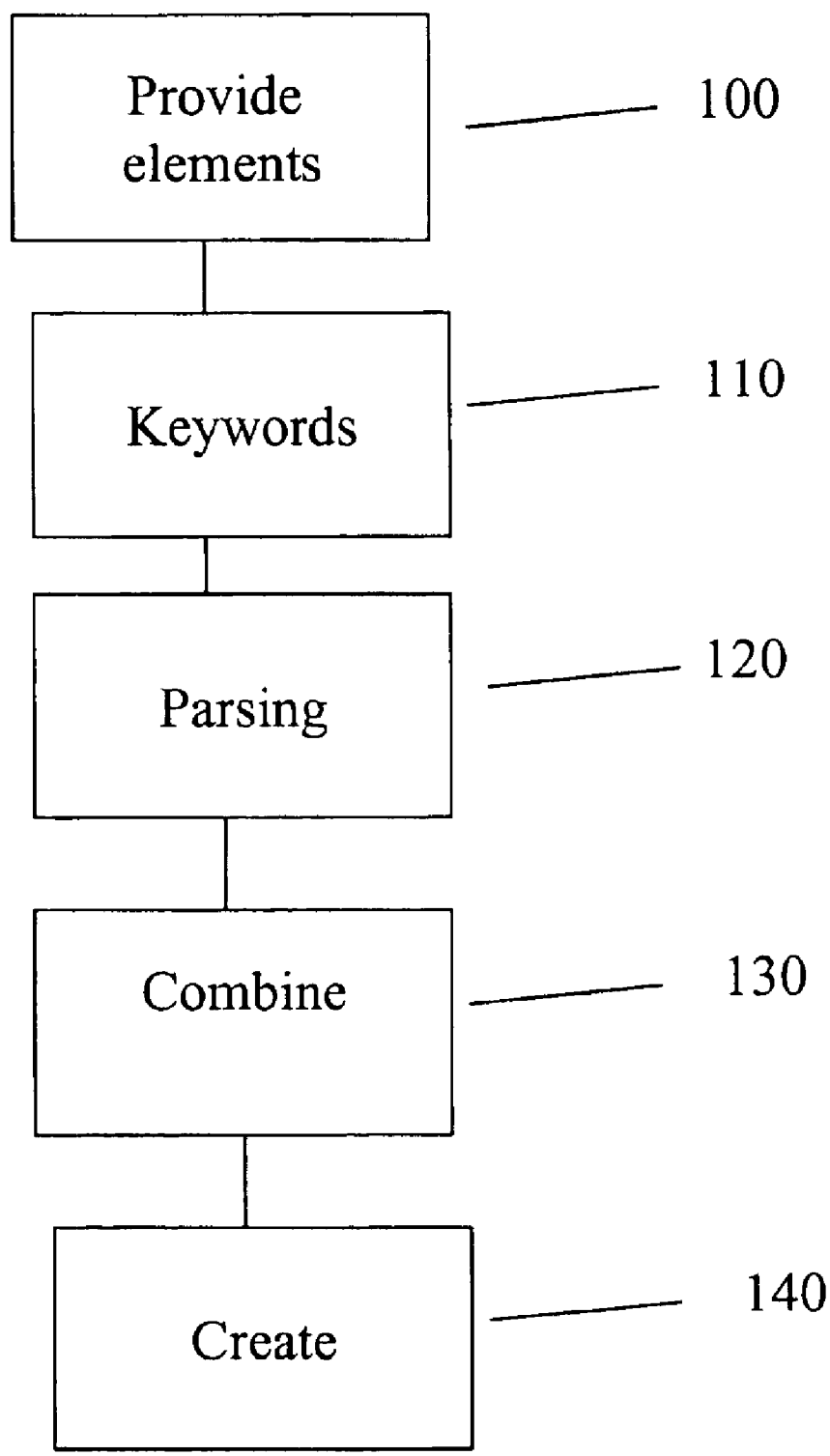
FIG. 1 is a flow showing steps in accordance with the invention.

The invention relates to a method and system of testing and/or verifying IC designs, and more particularly to a method and system of system-on-chip (SoC) design verification using improved simulation processes. In an embodiment of the invention, the system and method systematically reduces the size and complexity of simulation models by, for example, extracting only the exact resources required to run a specific test case, or set of test cases, on a design. In this manner, only the essential components needed to execute the test case(s) are actually built in the simulation model. This has the effect of reducing a complex SoC design to the least common parts, by only building and simulating those required parts. Thus, the system and method, in implementation, builds minimal simulation models, while not reducing verification efficacy.

Build of Materials (BOM) Generation

In one implementation, a build of materials (BOM) is constructed to perform verification of a design. By way of one illustrative example, the BOM includes a list of items that are required to verify the design of the IC. In implementation, the list may include a set of common required elements provided by the chip integrator, as well as a list of specific hardware resources for a specific test case. Thus, in one embodiment, the system and method constructs the BOM by combining chip base elements and test case specific elements to generate the necessary minimum BOM for a simulation model.

In one embodiment, the simulation model may be constructed and partitioned into individual and independent subsystems or test cases (e.g., individual design functions) for independent verification. In this way, the final simulation model may include only those partitions (models) which are needed to test a specific function of the design, which may include, amongst other variations, verifying functions across the partitions. This eliminates the need to model, load and simulate an entire chip design for testing each function. Instead, partitions or separate chip functions can be verified, exclusive of the entire design.

In embodiments, the partitioning is based on a test plan, which can be provided by the chip integrator. The test plan can then be translated into individual test cases for testing and verifying specific designed functions, without the need to load, simulate and verify the entire design. In one implementation, the partitions can be saved and reused, to leverage system resources, i.e., more efficiently use computer resources such as memory and storage, for common design functions for a specific IC. This eliminates the need to remodel such functions.

Referring to FIG. 1, the following steps may be used to generate the BOM data to build a simulation model. These steps may be implemented to allow an end user, only by specifying what test case(s) to run in the SoC simulation, the ability to automatically generate the smallest possible model for optimal simulation.

At step 100, a set of common required elements is provided by the chip integrator. These common elements may be non-test case specific and may be included for all models as basic to run. The non-test case specific elements are not required to be built and are used for verification, in one implementation. These common elements are typically environmental and are used describe the basic building blocks to construct the chip. By way of non-illustrative example, the non-test case specific elements may include a description of the microprocessor, busses, resets and clocks, to name a few.

At step 110, within the test case specification, the necessary hardware resource(s) are specified as a set of KEYWORDS, which can be used to specify test case required resources. In one embodiment, the listing of the hardware resources is required to create a specific test case for each function of the design to be verified. These hardware resources can be internal devices such as, for example, an Interrupt Controller, a DMA Controller, a Memory Controller and external devices such as memory models, external bus masters, etc.

In one specific illustrative example, IBM Corp. autoTOS™ (Application Definition File or ADF (where software resources are specified)) may be used to compile the user specified parameters (e.g., resources) in order to generate a specific test to verify. As should be known to those of skill in the art, autoTOS™ is a compiler tool used to automate test and generation processes. In one implementation, the auto-TOS™ can be used to generate test cases implementing a template, as should be understood by those of ordinary skill in the art.

At step 120, the system and method of the invention parses the resource keywords, per test case (or set of test cases), which are associated with the upcoming simulation run. The parsed resources are combined with the common elements at step 130, which, in turn, are used to produce a BOM model build file. The parsing may include identification of resources for each test case(s) such that the system and method is capable of identifying and accessing different BOMs or partitions for specific test cases.

At step 140, the BOM model build file is used to create Verilog "stub" file which is a file directing compilation of the subset or simulation model. As should be known to those of skill in the art, Verilog HDL is a hardware description language used to design and document electronic systems.

By using the above steps, it is possible to specify particular test cases to run in the SoC simulation. This allows the user to automatically generate the smallest possible model for optimal simulation.

Stub Files

In the method and system of the invention, stub files may be used to instruct the model build process; namely, the use of stub files may include files to implement the BOM model build file within the model build environment. By way of one embodiment, the stub files may instruct the model build process to install a fully functional model for each building block (e.g., functional block of the design), or an empty model, as discussed in more detail below.

Figure 2:
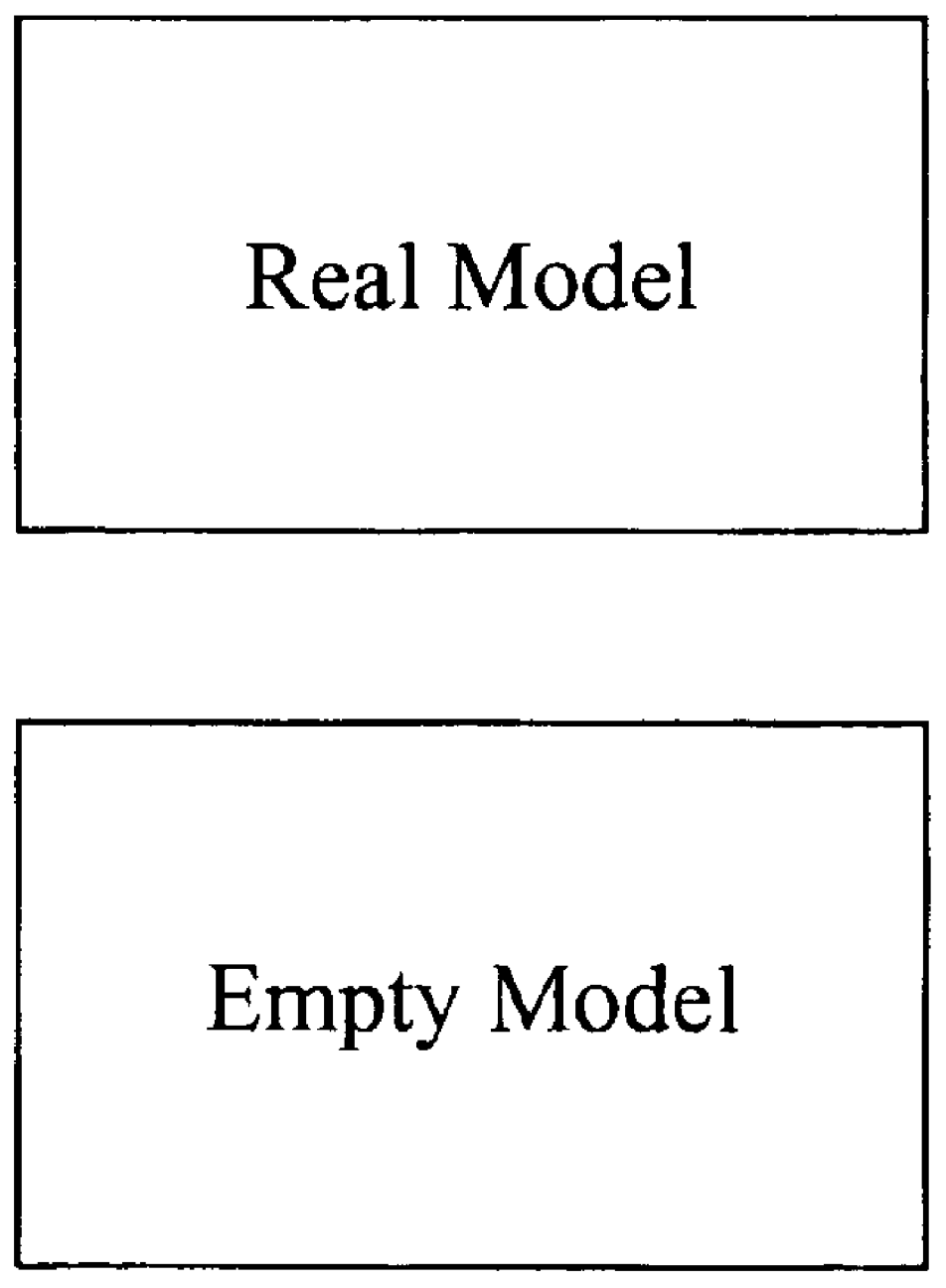

Referring to FIG. 2, in one illustrative example, each building block of the model includes two HDL (Hardware Description Language) representations. It should be understood by those of skill in the art, though, that HDL is but one implementation and that any known and existing verification system may be implemented with the invention.

Referring back to FIG. 2, one representation is a "real" model and the other representation is an "empty" model or box. The "real" model representation is a model which behaves accurately in simulation and which can be synthesized for one partition or a particular group of partitions. Thus, this "real" model representation is limited to a model describing the behavior of a particular function or interrelated functions to be verified (and does not include the entire design).

The "empty" box representation is the remaining portion(s) of the design which is not to be simulated and verified. In one implementation, inside the "empty" boxes are "tie-offs" which are used to assert all the outputs to their inactive state. This ensures that these boxes are not otherwise used in the simulation process of the particular partition to be verified. Naturally, the empty box representation simulates much faster and if this particular building block is not involved in this particular simulation, then there is no loss of accuracy of the simulation.

In one implementation of the invention, the system and method of the invention is an extension to current TOS ADF (application definition file) language which is used to perform the verification. Thus, by implementing the system and method of the invention, in one embodiment, the TOS ADF test operating system is used to represent the test case; instead of the entire model. That is, the TOS ADF may be used to implement the specific parameters for a specific partition, with the implementation of the system and method of the invention. In further implementations, the system and method of the invention is also used as an extension to TOS SDF (system definition file) language to specify common required elements needed for basic operation of a given chip.

The method as described herein is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

While the invention has been described in terms of exemplary embodiments, those skilled in the art will recognize that the invention can be practiced with modifications and in the spirit and scope of the appended claims.

What is claimed is:

1. A method for design verification implemented on storage medium resident on a computer infrastructure comprising:
   extracting resources required to run a discrete test case or set of associated test cases on a design using a processor of the computer infrastructure;
   building a simulation model based on the extracted resources using the processor of the computer infrastructure;
   executing the simulation model using only the extracted resources, exclusive of an entire design, to test a specific function or group of interrelated functions represented by the discrete test case or set of associated test cases for design verification using the processor of the computer infrastructure;
   parsing the resources for the test case or set of test cases associated with an upcoming simulation run using the processor of the computer infrastructure; and
   combining the parsed resources with common elements to produce a BOM model build file for compilation using the processor of the computer infrastructure, wherein:
      the BOM model build file creates "stub" files for compiling the simulation model,
      the stub files instruct a model build process to install a fully functional model and an empty model into the simulation model,
      the fully functional model behaves accurately in simulation and is synthesized for one partition or a particular group of partitions associated with the specific function or interrelated group of functions, respectively, to be verified, and
      the empty model is representative of remaining portions of the design which are not to be simulated and verified, and
   providing tie-offs using the processor of the computer infrastructure to assert all outputs of the empty model representation to an inactive state thereby ensuring that the empty model representation is not otherwise used in the simulation model.

2. The method of claim 1, wherein the extracted resources are constructed into partitions which are related to the specific function or group of interrelated functions of the design.

3. The method of claim 1, wherein the simulation model is partitioned into individual and independent test cases for independent verification needed to test a specific function or group of interrelated functions.

4. The method of claim 1, wherein the extracted resources include at least a set of common required elements and test case specified elements.

5. The method of claim 1, further comprising constructing a build of materials (BOM) generation which includes at least combining chip base elements and test case specific elements representative of the design.

6. The method of claim 5, wherein the chip base elements are at least a set of common non-test case specific elements.

7. The method of claim 5, further comprising, within the test case or set of test cases, providing the resources as a set of KEYWORDS, which are used to specify the resources for the test case or set of test cases.

8. The method of claim 7, wherein the resources are hardware and include at least one of internal and external resources.

9. The method of claim 1, wherein the parsing step includes identification and access to different BOM model build files for specific test cases.

10. A method for design verification implemented on storage medium resident on a computer infrastructure comprising:
    providing a set of common required elements;
    providing resources for a design;
    parsing the resources for a test case specification using a processor of the computer infrastructure;
    combining the parsed resources with the common required elements to produce a build of materials (BOM) model build file using the processor of the computer infrastructure;
    creating stub files, based on the BOM model build file, to compile a simulation model using the processor of the computer infrastructure;
    simulating a discrete function of the design for verification using the simulation model, exclusive of an entire deign using the processor of the computer infrastructure; and
    correlating a result of the simulated discrete function with a test plan using the processor of the computer infrastructure, wherein:
       the resources are hardware resources specified as a set of KEYWORDS used to specify test case required resources, the hardware resources create a specific test case for each function to be verified; and
       the BOM model file creates stub files instructing a model build process, the model build process including:
          building a real model representation and an empty model representation, the real model representation behaves accurately in simulation and is capable of being synthesized for the test case specification, representative of a function to be verified, exclusive of an entire design, and
          the empty model representation is representative of remaining portion(s) of the design which are not to be simulated and verified, and
          providing tie-offs using the processor of the computer infrastructure to assert all outputs of the empty model representation to an inactive state thereby ensuring that the empty model representation is not otherwise used in the simulation model.

11. The method of claim 10, wherein the set of common required elements include non-test case specific elements.

12. The method of claim 11, wherein the non-test case specific elements describe basic building blocks of the design for the simulation model.

13. The method of claim 10, wherein the simulation model includes partitions of individual and independent subsystems for independent verification of specific functions of the design, exclusive of the entire design.

14. The method of claim 10, wherein the BOM model build file is provided for a specific function of the design.

15. The method of claim 10, further comprising saving and reusing the BOM model build file to leverage system resources.

16. The method of claim 10, further comprising fabricating an integrated circuit chip.

17. The method of claim 16, further comprising distributing the integrated circuit chip.

18. The method of claim 10, further comprising systematically reducing a size and complexity of the simulation model by extracting only the resources required to run a specific test case, or set of test cases on a design using the simulation model.

19. The method of claim 10, further comprising compiling user specified parameters to generate a specific test to verify in the simulation model using application definition file (ADF).

20. A system for design verification, comprising:
a computer readable storage medium containing a computer readable program tangibly embodied thereon operable to provide:
   means for providing a set of common non-test case specific elements;
   means for specifying, as a set of keywords, resources used to specify test case required resources;
   means for parsing the set of keywords, per test case or set of test cases, associated with an upcoming simulation run;
   means for combining the parsed resource keywords with the common elements to produce a BOM model build file; and
   means for creating stub files using the BOM model build file, the stubs directing compilation of a simulation model to verify a discrete function of a design,
wherein the stub files instruct a model build process that builds a real model representation and an empty model representation, the real model representation behaves accurately in simulation and is capable of being synthesized for the test case specification, representative of a function to be verified, exclusive of an entire design, and the empty model representation is representative of remaining portion(s) of the design which are not to be simulated and verified and includes tie-offs to assert all outputs of the empty model representation to an inactive state thereby ensuring that the empty model representation is not otherwise used in the simulation model.

21. The system of claim 20, wherein the resources are hardware resources used to specify test case required resources.

22. A computer program product for design verification comprising a computer readable storage medium containing a computer readable program tangibly embodied thereon, wherein the computer readable program when executed on a computer causes the computer to:
   extract resources required to run a discrete test case or set of associated test cases on a design;
   build a simulation model based on the extracted resources;
   execute the simulation model using only the extracted resources, exclusive of an entire design, to test a specific function or group of interrelated functions represented by the discrete test case or set of associated test cases for design verification;
   correlate a result of the simulated discrete function with a test plan;
   parse the resources for the test case or set of test cases associated with an upcoming simulation run; and
   combine the parsed resources with common elements to produce a BOM model build file for compilation, wherein:
      the BOM model build file creates "stub" files for compiling the simulation model,
      the stub files instruct a model build process to install a fully functional model and an empty model into the simulation model,
      the fully functional model behaves accurately in simulation and is synthesized for one partition or a particular group of partitions associated with the specific function or interrelated group of functions, respectively, to be verified, and
      the empty model is representative of remaining portions of the design which are not to be simulated and verified and includes tie-offs to assert all outputs of the empty model representation to an inactive state thereby ensuring that the empty model representation is not otherwise used in the simulation model.

* * * * *